United States Patent
Lim

Patent Number: 6,127,859
Date of Patent: Oct. 3, 2000

[54] ALL-DIGITAL MINIMAL JITTER FREQUENCY SYNTHESIZER INCORPORATING AN IMPROVED PULSE STRIPPING METHOD TO REDUCE SPURIOUS TONES

[75] Inventor: Shiang Liang Lim, Singapore, Singapore

[73] Assignee: Tritech Microelectronics Ltd., Singapore, Singapore

[21] Appl. No.: 09/277,559

[22] Filed: Mar. 26, 1999

[51] Int. Cl.[7] .................................................. H04L 27/20
[52] U.S. Cl. ......................... 327/105; 327/106; 327/107
[58] Field of Search .................................. 327/105–107, 327/115, 117, 150, 151, 156, 159, 160; 377/47, 48

[56] References Cited

U.S. PATENT DOCUMENTS

| | | | |
|---|---|---|---|
| 4,746,870 | 5/1988 | Underhill | 328/14 |
| 5,187,722 | 2/1993 | Petty | 375/118 |
| 5,276,408 | 1/1994 | Norimatsu | 331/8 |
| 5,430,764 | 7/1995 | Chren, Jr. | 375/308 |
| 5,467,294 | 11/1995 | Hu et al. | 364/721 |
| 5,705,945 | 1/1998 | Wee | 327/105 |

OTHER PUBLICATIONS

Best, "Phase–Locked Loops", Theory, Design, and Applications, McGraw Hill, Inc., NY, (1993), pp. 202, 214, 216.

*Primary Examiner*—Tuan T. Lam
*Attorney, Agent, or Firm*—George O. Saile; Stephen B. Ackerman; Billy J. Knowles

[57] ABSTRACT

An all-digital frequency synthesizing system that will eliminate spurious frequencies that degrade the overall performance of the generation of a binary waveform. The frequency synthesizing system has a count series retention table that contains a series of count integers that are selected by a count signal that chooses which series of the integers are to be linked to a periodic reference counter. The periodic reference counter will count a number of periods of a periodic reference frequency and when the counter has reached the number of counts that is equal to the number of the count integer, the periodic output signal will be toggled from logic level to another logic level. A new periodic output signal period can be chosen by selecting a new series of count integers in the count retention table. A count compiler will create the series of count integers retained in the count retention table. The series of count integers will be disbursed in a manner to eliminate spurious frequencies from the periodic output signal.

36 Claims, 4 Drawing Sheets

ALL-DIGITAL MINIMAL JITTER FREQUENCY SYNTHESIZER INCORPORATING AN IMPROVED PULSE STRIPPING METHOD TO REDUCE SPURIOUS TONES

RELATED PATENT

This invention is related to U.S. Pat. No. 5,705,945 (Wee) filed Jul. 22, 1996, issued Jan. 6, 1998, and assigned to the same assignee as the present invention.

BACKGROUND OF THE INVENTION

1. Field of the Invention

This invention relates to frequency synthesizers and in particular to an all-digital frequency synthesizer and especially to techniques used to create a lower frequency clock from a high frequency clock.

2. Description of Related Art

It is well known in the art that a multiple number of frequencies can be generated from a single source. These techniques may be either analog or digital and may have output signals that are either analog sine waves or purely digital pulse trains.

A typical application for a frequency synthesizer is a phase locked loop. In a phase locked loop the output of frequency synthesizer is compared to a reference signal. An error signal that represents the difference in the phase and frequency of the output of the frequency synthesizer and the reference signal are used to vary the frequency of the frequency synthesizer. The error signal is passed through a loop filter to eliminate any response to unwanted transient signals. As the error signal approaches zero, the phase locked loop is said to be locked.

A digital phase locked loop originally contained a binary reference signal and a binary output signal with an analog frequency synthesizer, loop filter and comparator. As digital circuits have improved in performance, the components may now be implemented in digital circuitry or a software program on a microcomputer.

Figure 1:
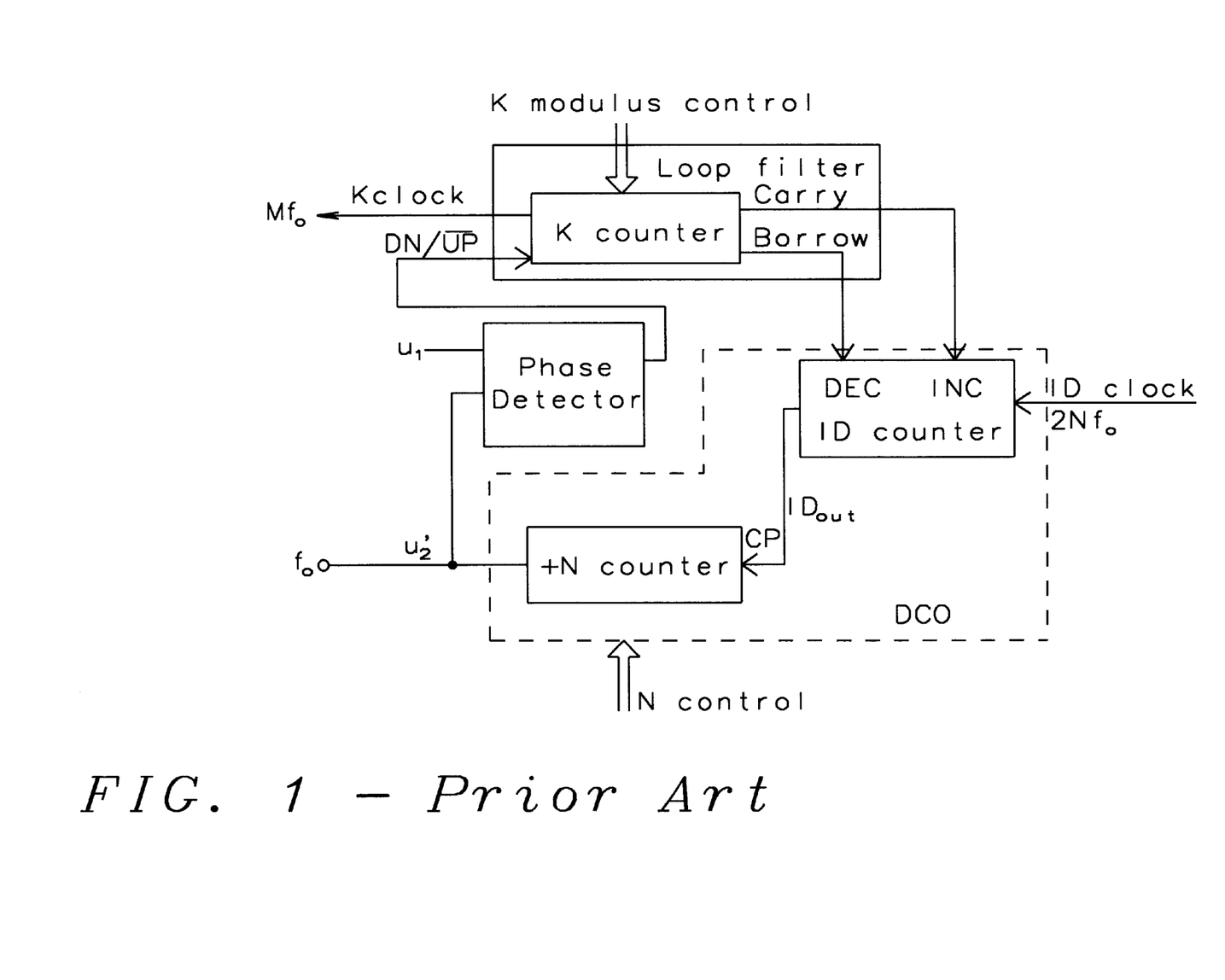
FIG. 1 is a block diagram of an all-digital phase locked loop containing a frequency synthesizer of prior art.

FIG. 1 shows a block diagram of an all digital phase locked loop as described in *Phase Locked Loops: Theory, Design, and Application* by Best, McGraw-Hill Inc. 1993. The phase detector compares the output $u_2$ of the digital control oscillator DCO with the digital reference signal $u_1$. The output of the phase detector is connected to the DN/$\overline{UP}$ input of the counter, which forms the loop filter. The K clock is an input to the K counter that is frequency that is a frequency that is a factor M times the desired output frequency $F_o$ of the digital controlled oscillator DCO. The K Modulus Control sets the number at which the K counter will have carry signal.

The DN/$\overline{UP}$ input to the K counter causes the K counter to count up to the value of the K Modulus if the DN/$\overline{UP}$ input has a level to activate the up counting. The DN/$\overline{UP}$ input causes the K counter to count down to zero if the DN/$\overline{UP}$ input has a level to activate the down counting. If the K counter exceeds the value of the K Modulus, the carry output is activated. If the K counter is decremented to less than zero, the borrow output is activated.

If the signals $u_1$ and $u_2$ are of identical frequency and phase, the output of the phase detector will be a square wave. This will cause the K counter to count up for the first level of the square wave and to count down for the second level of the square wave. As long as the DN/$\overline{UP}$ input signal is a balance square wave, neither the carry or the borrow outputs will be triggered. If the signals $u_1$ and $u_2$ become out of phase and of unequal frequency, the period of the signal at the DN/$\overline{UP}$ input will not have equal period at the first level versus the second level and there will eventually be either a carry or a borrow signal.

The digital control oscillator DCO has and increment/decrement counter (ID counter). The ID clock input of the ID counter is a frequency that is a fraction of two times a factor N times the frequency $F_o$ of the output signal $u_2$. The output $ID_{out}$ will be a frequency that is one half of the input ID clock.

The carry output of the Loop Filter is connected to the increment input INC of the ID counter and the borrow output of the Loop Filter is connected to the decrement input DEC of the ID counter. If the carry signal is activated, a single pulse is added to the ID counter output signal $ID_{out}$ and conversely if the borrow signal is activated, a single pulse is subtracted from the ID counter output $ID_{out}$.

The ID counter output $ID_{out}$ is connected tot he input CP of the ÷N counter. The N control determines the factor of N that the input CP is divided by to form the frequency $F_o$ of the output $u_2$.

The variance of the phase and frequency of the output $u_2$ from the desired frequency is called jitter. As the phase detector compares the reference signal $u_1$ to the output signal $u_2$, any difference in frequency will be a function of the weighted number of carry pulses from the K counter versus the number of borrow pulses. The size of the error maybe on the order of the pulse width of the two signals $u_1$ and $u_2$. Also the time required to become totally locked to a new reference frequency $u_1$ will be a function of the frequency of the K clock and again maybe as long as the pulse width of the reference signal $u_1$ and the output signal $u_2$.

U.S. Pat. No. 5,430,764 (Chren, Jr.) describes a frequency synthesizer using a residue number system to generate an address to find a value in a look-up table containing the digital values of a sine wave. These values are presented to a digital-to-analog converter to create an analog sine wave output.

U.S. Pat. No. 5,467,294 (Hsu, et al.) illustrates an apparatus for the programmable generation of sine waves. The digital values to describe the sine wave are maintained in a ROM lookup table.

U.S. Pat. No. 4,746,870 (Underhill) describes a frequency synthesizer with reduced jitter. The frequency synthesizer has a reference frequency source, a frequency reduction means, and a jitter compensation signal circuit. The frequency reduction means cancels pulses from a frequency to be reduced. The jitter compensation signal circuit is arranged to compensate for any jitter in the output frequency that would otherwise be caused by each cancelled cycle. The jitter compensation signal is derived from a jitter-containing pulse train via a D.C. removal circuit and an integrator. Additionally, a perturbation signal is injected by a control device which causes pulses to be added to and also to be subtracted, by a pulse addition and a "pulse swallowing" circuit respectively, from the frequency to be reduced. The jitter caused by this addition and subtraction also being compensated for by the compensation signal circuit.

U.S. Pat. No. 5,187,722 (Petty) teaches a frequency synthesis circuit which provides an output frequency that greater than a fractional multiple of a reference signal frequency. The frequency synthesis circuit utilizes a fraction multiplier that is placed in the feedback path of a phase locked loop. The fractional multiplication provided is equal to the ratio of the reference signal frequency the desired frequency. The circuit can be utilized in either analog or digitally implemented phase-locked loops and can be coupled with the use a fractional multiplier in the feedforward path of the digitally implemented phase locked loop to improve jitter performance.

U.S. Pat. No. 5,276,408 (Norimatsu) discloses a phase locked loop frequency synthesizer that can modify output frequency at high speed. The frequency synthesizer has, a first pulse removing circuit connected between a reference signal generator and a phase-frequency comparator. A second pulse removing circuit is connected between a variable frequency divider and the phase-frequency comparator. Upon receiving of a first removing data indicative of a first pulse number, the first pulse removing circuit removes pulses from the reference signal that are equal in number to the first pulse number for a first predetermined cycle to produce a first pulse removed signal. Upon receiving of a second removing data indicative of a second pulse number, the second pulse removing circuit removes pulses from the divided signal that are equal in number to the second pulse number for a second predetermined cycle to produce a second pulse removed signal. The current controlling circuit controls current supplied from/to a charge pump circuit after receiving a current command. A control circuit is connected between the phase-frequency comparator and the charge pump circuit. A switch is inserted between the loop filter and the voltage controlled oscillator. When the switch switches off a PLL, a DIA converter supplies a control voltage to the voltage controlled oscillator and a filter capacitor of the loop filter. The charge pump circuit comprises a control circuit, a constant current circuit, an integrating circuit, and a sample and hold circuit.

SUMMARY OF THE INVENTION

An object of this invention is the generation of a binary waveform of a frequency that is synchronized to a reference signal, wherein any change in the binary waveform is accomplished with little time.

Another object of this invention is to have a binary waveform with minimal jitter. Still another object of this invention is the elimination of spurious frequencies that degrade the overall performance of the generation of the binary waveform.

To accomplish these and other objects, the present invention provides a frequency synthesizing system that will generate a periodic output signal. The periodic output signal has a period that is composed of multiple periods of a periodic reference signal.

The frequency synthesizing system has a count compiler to generate a series of counting integers representing the number of periods of the periodic reference signal that compose the period of the periodic output signal. The frequency synthesizing system also has a count series retention table to store a plurality of the series of counting integers; a count incrementing means to select the individual counting integers within the count series retention table; a frequency generation means that will count the number of periods in the period reference signal and when the count is equal to the integer of the from the count series retention table will force the periodic output signal to change from one logic level to another. The count incrementing means will increment and the process will repeat continuously. If a different period for the periodic output signal is required, then a count select signal will choose another series of counting integers and a different series of counting integers will be presented to the frequency generation means.

The count compiler executes a first embodiment of the method to construct the series of counting integers by first dividing the frequency of the periodic reference signal by the frequency selected periodic output signal to form a quotient. The quotient is then decomposed into a weighted average of a first integer and a second integer such that the first integer is a largest integer lesser than the quotient and the second integer is a value of the first integer plus one. The quotient is simplified to a mixed number having an integer and a fraction, wherein the fraction has a numerator and a denominator. A series of counting integers is created that include the first and second integers. The number of counting integers is the value of the denominator and the number of second integers in the series of integers is the value of the numerator by the denominator and the number of first integers is the difference of the denominator and the numerator. The first integers and the second integers are then distributed uniformly over the series of counting integers.

The distribution of the series of counting integers is accomplished first by comparing the number of the first integers to the number of the second integers. The denominator is divided by a lessor of the number of the first integers and the number of the second integers to form an approximation quotient. The approximation quotient is then truncated to eliminate any fractional part from the approximation quotient to form an interspersal ratio, which is a size of a subsegment of the counting series.

If the lessor of the numbers of the first integers and the number of second integers is the number of first integers, the number of first integers in one subsegment is set to one and the number of second integers in the one subsegment is set to the interspersal ratio less one. However, if the lessor of the numbers of the first integers and the number of second integers is the number of second integers, the number of first integers in one subsegment is set to the interspersal ratio less one and the number of second integers in the one subsegment is set to one. The subsegment of the counting series is then arranged such that the first integers are arranged firstly in the subsegment and the second integers are arranged secondly in the subsegment. Each subsegment is then repeated until the number of subsegments is equal to the lessor of the numbers of the first integers and the number of second integers. If the lessor of the numbers of the first integers and the number of second integers is the number of first integers, the residual of the second integers are repeated until the number of second integers have been placed in the counting series. Or if the lessor of the numbers of the first integers and the number of second integers is the number of second integers, the residual of the first integers are repeated until the number of first integers have been placed in the counting series.

A first enhancement to further distribute the residual of the first integers or the second integers begins by first determining a residual interspersal ratio. The residual interspersal ratio is formed by dividing the product of the interspersal ratio and the lessor of the number of first integers and the second integers by a number of the residual numbers. The residual numbers are then dispersed over the series of counting integers such that one residual number is placed after a group of series of the counting integers. The number of the group of the counting integers is equal to the residual interspersal ratio.

A second enhancement to further distribute the residual of the first integers or the second integers begins by first determining a residual interspersal ratio by dividing the lessor of the number of first integers and the second integers by a number of the residual numbers. The residual numbers are then dispersed over the subsegments of the series of counting integers such that one residual number is placed after a number of subsegments. The number of subsegments is equal to the residual interspersal ratio.

The count compiler may execute an alternate method to construct a series of counting integers representing the number of periods of the periods of the periodic reference signal needed to generate a periodic output signal. The alternate method of constructing the series of counting integers by first dividing the frequency selected periodic output signal by the frequency of the periodic reference signal to form a quotient. The quotient is then decomposed into a weighted average of a first integer and a second integer such that the first integer is a largest integer lesser than the quotient and the second integer is a value of the first integer plus one. The quotient is simplified to a mixed number having an integer and a fraction, wherein the fraction has a numerator and a denominator. A series of counting integers is created that include the first and second integers. The number of counting integers is the value of the denominator and the number of second integers in the series of integers is the value of a residue of a dividing of the numerator by the denominator and the number of first integers is the difference of the denominator and the residue. The first integers and the second integers are then distributed uniformly over the series of counting integers.

The distribution of the series of counting integers is accomplished first by comparing the number of the first integers to the number of the second integers. The denominator is divided by a lessor of the number of the first integers and the number of the second integers to form an approximation quotient. The approximation quotient is then truncated to eliminate any fractional part from the approximation quotient to form an interspersal ratio, which is a size of a subsegment of the counting series.

If the lessor of the numbers of the first integers and the number of second integers is the number of first integers, the number of first integers in one subsegment is set to one and the number of second integers in the one subsegment is set to the interspersal ratio less one. However, if the lessor of the numbers of the first integers and the number of second integers is the number of second integers, the number of first integers in one subsegment is set to the interspersal ratio less one and the number of second integers in the one subsegment is set to one. The subsegment of the counting series is then arranged such that the first integers are arranged firstly in the subsegment and the second integers are arranged secondly in the subsegment. Each subsegment is then repeated until the number of subsegments is equal to the lessor of the numbers of the first integers and the number of second integers. The number of first and second integers of the counting series will be the product of the interspersal ratio and lessor of the numbers of the first integers and the number of second integers.

The distribution of the series of counting integers are such that any spurious tones of the periodic output signal are at a higher frequencies. The spurious tones can then be filtered from the period output signal.

DETAILED DESCRIPTION OF THE INVENTION

Figure 2:
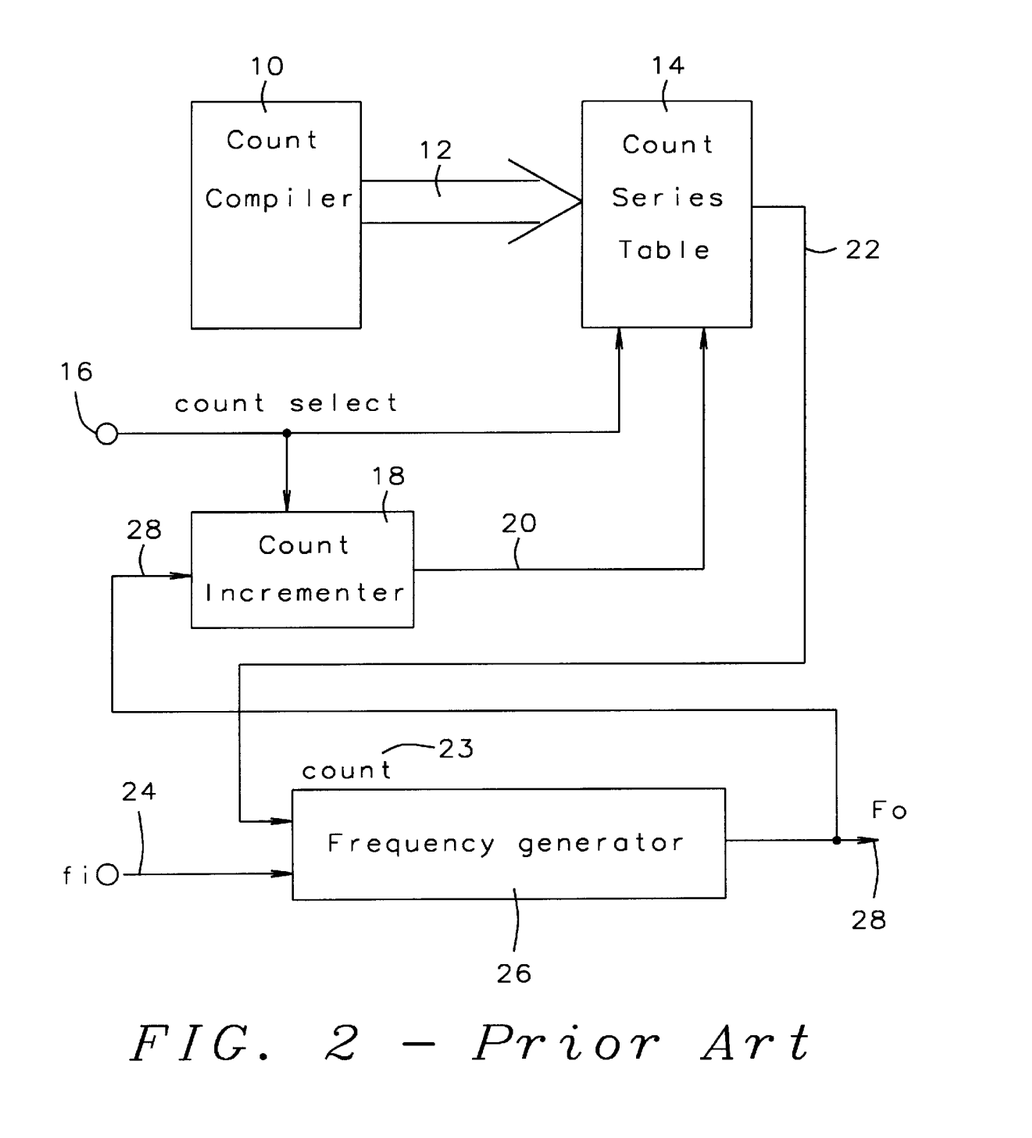
FIG. 2 is a block diagram of an all digital frequency synthesizer of this invention.

Refer now to FIG. 2 for a description of an all digital frequency synthesizer having minimal jitter similar to that described in U.S. Pat. No. 5,705,945 (Wee). A frequency generator 26 has an input frequency ($f_i$) 24. The output frequency $F_o$ is derived by creating each period of time that elapses between a transition of the output 28 from a logical 1 to a logical 0 or from a logical 0 to a logical 1. The period of time for the output frequency $F_o$ is determined by counting a number of clock edges of the input frequency ($f_i$) 24 and toggling the output 28 from one logic level to another then counting the clock edges of the input frequency 24 again and then toggling the output 28 again from the one logic level back to the original logic level. This process is repeated to form the output frequency $F_o$ at the output 28.

The number of pulses of the input frequency 24 to be counted is set by the count input 23 of the frequency generator 26. If the ratio ($X_n$) of the output frequency $F_o$ to the input frequency $f_i$ is an integer, the count input 23 is set to the value of that integer. For example if:

$F_o$=2.457 Mhz $f_i$=12.288 Mhz count=$f_i/F_o$=$X_n$=5.

Therefore, the count input 23 has the value of 5 and the frequency generator 26 will set the output at the beginning of the sequence to a logic 1, then count 5 clock edges of the input frequency 24 then toggle the output to a logic 0 and count 5 clock edges of the input frequency 24 and repeat this process continuously.

However, if the ratio $X_n$ of the input frequency $f_i$ to the output frequency $F_o$ is a mixed number of an integer and a fraction, it then must be decomposed into a series of numbers that is the weighted average of two integers, wherein the two integers are consecutive integers. The smaller of the two integers is the integer lesser than the mixed number and the larger number is the next larger integer. For example:

$F_o$=2.560 Mhz $f_i$=12.288 Mhz count=$f_i/F_o$=$X_n$=4⅘

$r_n$=smallest number=4

$s_n$=largest number=$r_n$+1=5

The numerator of the weighted average of the ratio $X_n$ of the input frequency $f_i$ to the output frequency $F_o$, will form a summation of a series $S_n$ of the two integers $r_n$ and $s_n$. That is $S_n$=$r_n$,$s_n$, $r_n$, $s_n$, . . . $r_n$, $s_n$. The number of terms in the series $S_n$ is the denominator $q_n$ of the fraction of the mixed number and the number of the terms $N_s$ of the largest number $s_n$ in the series $S_n$ is the numerator of the fraction in the ratio $X_n$. The number of terms $N_r$ of the smallest number $r_n$ in the series $S_n$ is the difference between the denominator $q_n$ of the fraction of the mixed number and the number of the terms $N_s$ of the largest number $s_n$ in the series $S_n$. In general the formula of the ratio $X_n$ is:

$$X_n = \frac{f_i}{F_o} = r_n \frac{N_s}{q_n}$$

where:

$r_n$ is the smallest number.

$N_s$ is the number of terms of the largest number $s_n$.

$q_n$ is the denominator of the ratio $X_n$.

The above fraction is formed by simplifying of the mixed number by searching for the lowest common denominator of the fraction. From the example above:

$$X_n = \frac{12,288,000}{2,560,000} =$$

$$4 + \frac{2048}{2560} = 4 + \frac{\cancel{2 \times 2 \times 2 \times 2 \times 2 \times 2 \times 2 \times 2 \times 2} 2 \times 2}{\cancel{2 \times 2 \times 2 \times 2 \times 2 \times 2 \times 2 \times 2} 5} = 4 + \frac{4}{5}.$$

From the above it can be seen that the $q_n=5$. Continuing the above example:

$X_n = 4\frac{4}{5}$ $q_n = 5$ $r_n = 4$ $s_n = 5$

The number of terms $N_s$ of the largest number $s_n$ is $N_s=4$. The number of terms $N_r$ of the smallest number $r_n$ is $N_r = q_n - s_n = 1$. Therefore:

$$X_n = \frac{5 + 4 + 5 + 5 + 5}{5}$$

$S_n = 5, 4, 5, 5, 5.$

The series $S_n$ is stored in the count series retention table 14. The count series retention table is implemented as a register based look-up table, a read-only memory, or other logic structure that can contain the series of counting integers. The output 22 of the count series retention table 14 is connected to the count input 23 of the frequency generator 26.

The count compiler 10 is a subfunction of an automated design system that will calculate the entries to be placed in the count series retention table 14. The count compiler 10 will have the value of the input frequency $f_i$ and a listing of the desired output frequencies $F_o$ from which to compile each series of the counting integers as described above. The series of counting integers are placed in the count series retention table 14 through interface 12. Interface 12 is a software compiling of the count series retention table 14 or a programming of the count series retention table 14 at the assembly of hardware for the frequency synthesizer.

The count select line 16 determines which series of the counting integers in the count series retention table 14 is to be sequentially presented to the frequency generator 26.

The output frequency $F_o$ of the frequency generator 26 will remain constant with the jitter of one clock edge of the input frequency $f_i$ cycle, since the counting integers differ by a value of 1. This difference of 1 within the series of counting integers translates to the period of one clock edge of the input frequency $f_i$.

Figure 3:
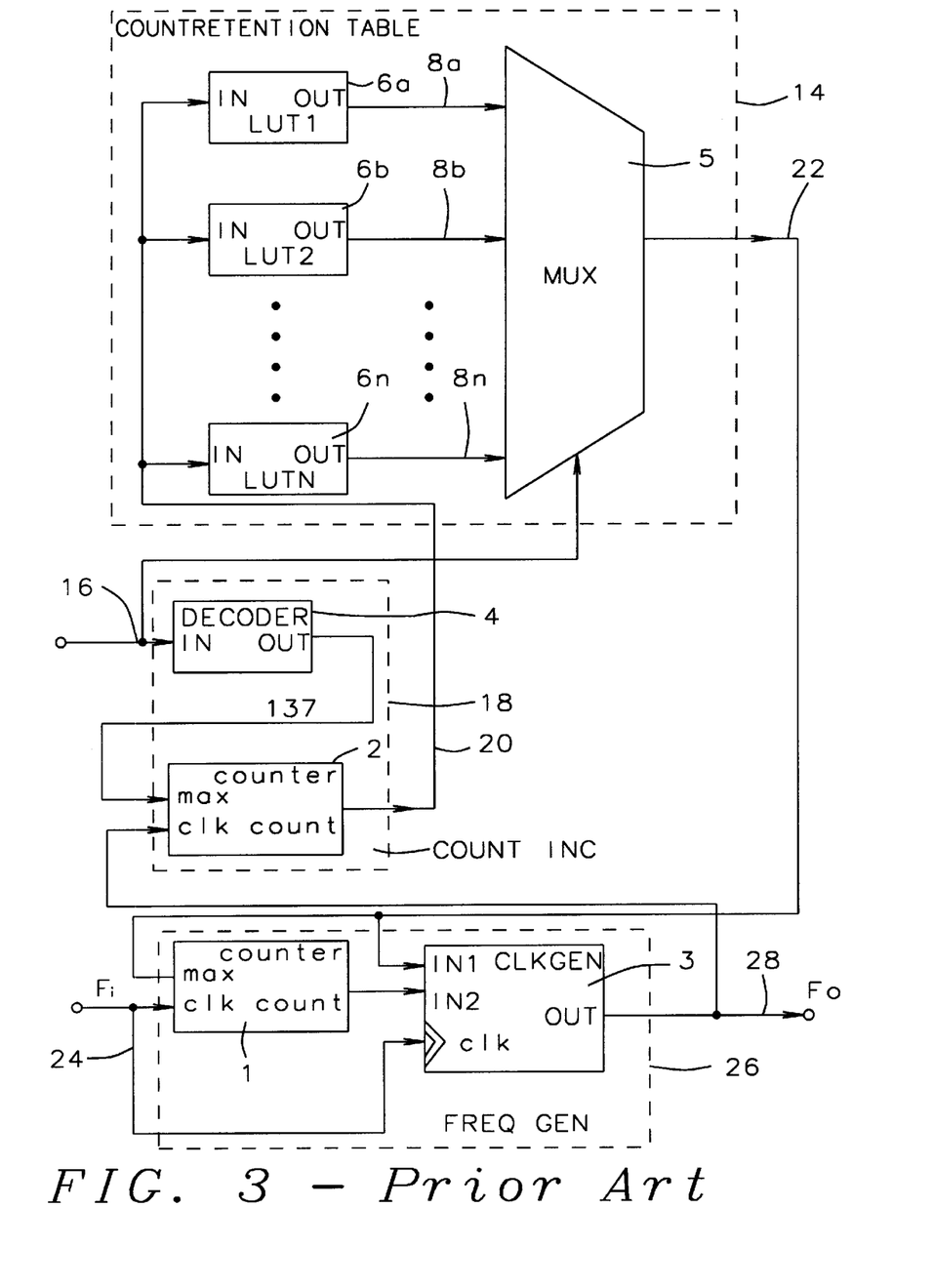
FIG. 3 is a functional block diagram detailing an all digital frequency synthesizer of this invention.

Referring to FIG. 3, the counts series table 14 has a plurality of look-up tables 6a, 6b, ..., 6n that contain the plurality of series of counting integers. The output 8a, 8b, ..., 8n of each look-up table 6a, 6b, ..., 6n is connected to a multiplexer 5. The count select line 16 is decoded in the multiplexer 5 to place one of the outputs 8a, 8b, ..., 8n at the output 22 of the multiplexer 5.

The output 20 of the count incrementer 18 is connected to the count look-up tables 6a, 6b, ..., 6n, to increment the look-up tables 6a, 6b, ... 6n through the series of counting integers.

The count incrementer 18 has a decoder 4 and a counter 2. The decoder 4 determines the number of integers in the series of counting integers from the value of the count select input 16. The value of the number of integers in the series of counting integers is the input 13 to the counter 2. The output 20 of the counter 2 will increment at the end of the period of the output frequency $F_o$. The increment will reset to the beginning of the series of the counting integers when the counter 2 reaches the value of the output 13 of the decoder 4.

The frequency generator 26 has a counter 1 that will count the number of periods of the input frequency 24. The input frequency 24 is connected to the clock input clk of the counter 1 and the output 22 of the count series retention table 14 is connected to the maximum count input MAX of the counter 1.

The counter 1 will place a logical 1 on the output count when the number of clock edges of the input frequency 24 equal to the number at the input MAX. The counter 1 will reset and start counting again. This process will continue iteratively. The output count is connected to the input clk of the clock generator 3 and the output 22 of the count series retention table 14 is connected to the input IN1 of the clock generator 3. The output OUT of the clock generator 3 is the frequency output 28. The output 28 will toggle from one logic state to another logic state at the reception of the signal from the output count of the counter 1, a transition of the input frequency 24. The output 22 contains the "divide by" value for the clock generator 3 for the present counting period. This value changes as the series $S_n$ is paced on the output 22 of the count retention table 14.

The counters 1 and 2 can be designed to switch at the positive edge, the negative edge, or both the positive or the negative edges of the clock input clk. If both edges are used to trigger the counter 1, or 2, the input reference frequency $f_i$ is effectively doubled. The only detriment of this doubling is that if the duty cycle, or the amount of time that the clock is at a logical 1 versus the amount of time it is a logical zero is not 50% or equal, the output jitter will be increased by the amount of the imbalance in this time.

As described above the count compiler 10 of FIG. 2 will determine the count series $S_n$. If the count series $S_n$ is distributed inappropriately such all the terms of the smallest number $r_n$ are grouped together within the period of the count series $S_n$ of pulses and the all the terms for the largest number $s_n$ are grouped together within the series $S_n$ of pulses, there may be spurious frequencies present in the output clock $F_o$. These spurious frequencies cause undesirable tones in applications such as pulse coded modulation (PCM).

To minimize the spurious frequencies within the output clock $F_o$, the distribution of the smallest number $r_n$ and the largest number $s_n$ should be relatively uniformly interspersed within the counting series $S_n$.

Figure 4A:
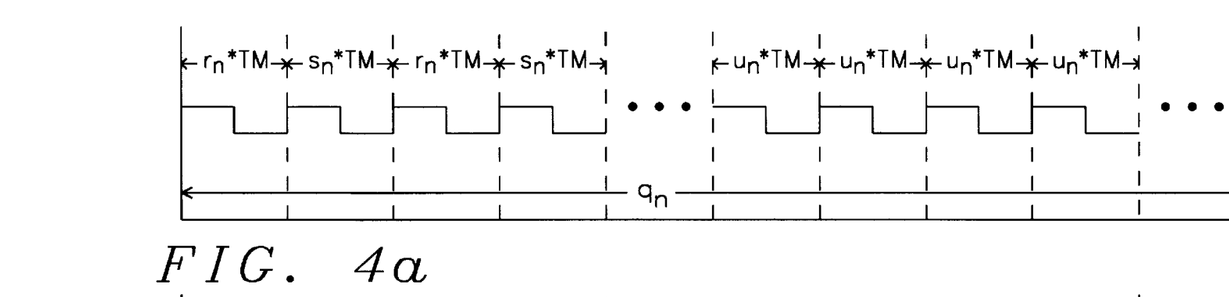
FIGS. 4a, 4b, and 4c are plots of the waveforms of the periodic output signal of the frequency synthesizer of this invention illustrating the methods of distribution of the series of counting integers.

FIG. 4a shows the resulting waveform for the output clock $F_o$ created from the counting series:

$$S_n = (r_n, s_n, r_n, s_n, \ldots, u_n, u_n, u_n, u_n).$$

The residual numbers $u_n$ are the excess of the largest quantity of numbers in the counting series $S_n$. That is:

$$u_n = \begin{array}{l} s_n \\ r_n \end{array} \begin{array}{l} N_r < N_s \\ N_r > N_s. \end{array}$$

The number $N_u$ of the residual numbers $u_n$ in this case will be:

$$N_u = \begin{array}{l} q_n - 2N_r \\ q_n - 2N_s \end{array} \begin{array}{l} N_r < N_s \\ N_r > N_s. \end{array}$$

This distribution, while an improvement, will still contain undesirable spurious frequencies in the output clock $F_o$.

Figure 4B:
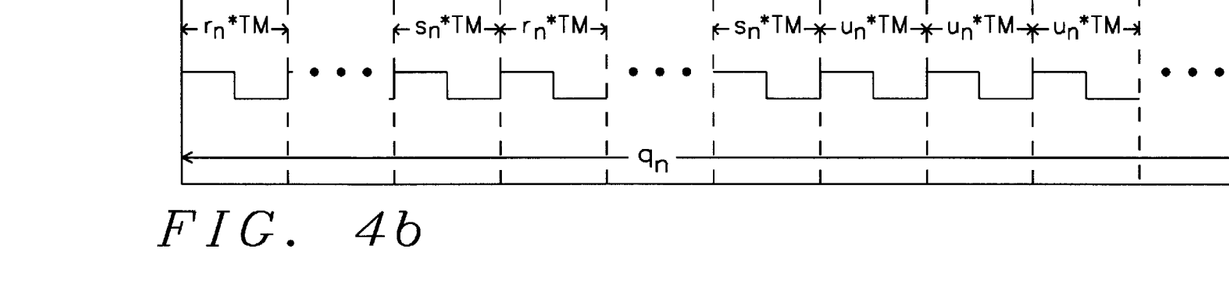

A second case, which is the first embodiment of this invention is shown in FIG. 4b. FIG. 4b is the resulting waveform of the output clock $F_o$ of the frequency synthesizer of FIG. 2. The objective being to minimize the number of residual numbers $N_u$ from the series $S_n$. The count compiler will determine the integers $r_n$ and $s_n$. The period of the output frequency $F_o$ will be the product of the smallest number $r_n$ and the period $T_m$ of the input frequency $f_i$ or the product of the largest number $s_n$ and the period $T_m$ of the input frequency $f_i$. The waveform will be formed by interleaving the waveforms having periods equal to the product of the smallest number $r_n$ and the period $T_m$ of the input frequency $f_i$ and the waveforms having periods equal to the product of the largest number $s_n$ and the period $T_m$ of the input frequency $f_i$. The count compiler will use the counting series $S_n$, where:

$$S_n = (r_n, r_n, \ldots, s_n, r_n, r_n, \ldots, s_n, \ldots, u_n, u_n, u_n, \ldots).$$

In this case an interspersal ratio $I_r$ is defined as the number of terms in a subsegment $X_n$ within the counting series $S_n$ that will contain one (1) repetition of the lessor of the number $N_r$ of the smallest numbers $r_n$ or the number $N_s$ of the largest numbers $s_n$. The interspersal ratio $I_r$ is the integer portion of the function:

$$I_r = \begin{array}{l} \text{int}\left(\frac{q_n}{N_r}\right) \\ \text{int}\left(\frac{q_n}{N_s}\right) \end{array} \begin{array}{l} N_r < N_s \\ N_r > N_s. \end{array}$$

The subsegment $X_n$ within the counting series $S_n$ will have a number of terms equal to the interspersal ratio $I_r$. If the interspersal ratio $I_r$ is determined by the number $N_r$ of the smallest numbers $r_n$, there will be one occurrence of the smallest number $r_n$ followed by $I_r-1$ occurrences of the largest counting number $s_n$. That is the counting series $S_n$ will be:

$$S_n = \left( \frac{r_n, s_n, \ldots s_n}{X_n}, \frac{r_n, s_n, \ldots s_n}{X_n}, \ldots, s_n, s_n \ldots \right).$$

However, if the interspersal ratio $I_r$ is determined by the number $N_s$ of the largest numbers $s_n$, then there will be $I_r-1$ occurrences of the smallest number $r_n$ followed by one (1) occurrence of the largest number $s_n$. That is the counting series $S_n$ will be:

$$S_n = \left( \frac{r_n \ldots, r_n, s_n}{X_n}, \frac{r_n, \ldots, r_n, s_n}{X_n}, \ldots r_n, r_n, \ldots \right).$$

The total number of terms $N_x$ of all the subsegments $X_n$ will be the product of the interspersal ratio $I_r$ and the lessor of the number $N_r$ of the smallest numbers $r_n$ and the number $N_s$ of the largest number $s_n$. That is:

$$N_x = \begin{array}{l} I_r N_r \\ I_r N_s \end{array} \begin{array}{l} N_r < N_s \\ N_r > N_s. \end{array}$$

The number of residual numbers $N_u$ is the difference between the total number of terms $q_n$ in the counting series $S_n$ and the total number of terms $N_x$ in all subsegments. That is:

$$N_u = q_n - N_x.$$

The residual terms $u_n$ will be the largest numbers $s_n$ if the number $N_s$ of the largest numbers $s_n$ is greater than the number $N_r$ of the smallest numbers $r_n$, and conversely, the residual terms $u_n$ will be the smallest number $r_n$ if the number $N_s$ of largest numbers $s_n$ is less than the number of the smallest numbers $r_n$. That is:

$$u_n = \begin{array}{l} s_n \\ r_n \end{array} \begin{array}{l} N_r < N_s \\ N_r > N_s. \end{array}$$

The first embodiment as above described still has a residual component created by the residual terms $u_n$ that contributes to the undesirable spurious frequencies in the output clock $F_o$. To minimize these contributions of the residual terms $u_n$, the first embodiment is enhanced to distribute the residual terms $u_n$ over the groups of subsegments $X_n$. There are two methods to accomplish the distributions. The first method distributes the residual terms evenly over all the terms of the subsegments $X_n$. The residual interspersal ratio $I_w$ indicates the number of terms in the subsegments $X_n$ after which a residual terms $u_n$ is placed. The residual interspersal ratio is determined as:

$$I_w = \text{int}\, \frac{N_x}{N_u}.$$

The counting series will have one residual terms $u_n$ placed within the final subsegment $x_n$ of a group of subsegments $x_n$. The group of subsegments has a number of subsegments equal to the residual interspersal ratio $I_w$. That is, if the residual terms are the largest number $s_n$, one of the residual largest numbers $s_{un}$ is added to the final subsegment of the group of subsegments as shown:

$$S_n = \underbrace{\underbrace{r_n, s_n, \ldots, s_n}_{X_n}, \underbrace{r_n, s_n, \ldots, s_n}_{X_n}, r_n, s_n, \ldots, s_{un}, \ldots, \underbrace{r_n, s_n, \ldots, s_n}_{X_n}}_{I_w}.$$

where:

$s_{un}$ is the residual largest number.

Further, if the residual terms are the smallest number $r_n$, one of the residual smallest numbers $r_{un}$ is added to the final subsegment of the group of subsegments as shown:

$$S_n = \underbrace{\underbrace{s_n, r_n, \ldots, r_n}_{X_n}, \underbrace{s_n, r_n, \ldots, r_n}_{X_n}, s_n, r_n, \ldots, r_{un}, \ldots, \underbrace{s_n, r_n, \ldots, r_n}_{X_n}}_{I_w}.$$

where:

$r_{un}$ is the residual largest number.

The second method places the residual terms $u_n$ evenly over the subsegments $x_n$ of the counting series $S_n$. That is a residual term $u_n$ is placed between two subsegments $x_n$ of the counting series $S_n$. In this second method, the residual interspersal ratio $I_w$ determines the number of segments after which each residual term is placed. In this method, the residual interspersal ratio is determined as:

$$I_w = \begin{array}{c|c} \text{int}\left(\frac{N_r}{N_u}\right) & N_r < N_s \\ \text{int}\left(\frac{N_s}{N_u}\right) & N_s < N_r. \end{array}$$

The counting series will have one residual terms $u_n$ placed after the final subsegment $x_n$ of a group of subsegments $x_n$. The group of subsegments has a number of subsegments equal to the residual interspersal ratio $I_w$. That is, if the residual terms are the largest number $s_n$, one of the residual largest numbers $s_{un}$ is added after the final subsegment of the group of subsegments as shown:

$$S_n = \underbrace{x_n, x_n, \ldots x_n}_{I_w}, s_{un}, \underbrace{x_n, x_n, \ldots, x_n}_{I_w}, \ldots.$$

Further, if the residual terms are the smallest number $r_n$, one of the residual smallest numbers $r_{un}$ is added after the final subsegment of the group of subsegments as shown:

$$S_n = \underbrace{x_n, x_n, \ldots x_n}_{I_w}, r_{un}, \underbrace{x_n, x_n, \ldots, x_n}_{I_w}, \ldots$$

Figure 4C:
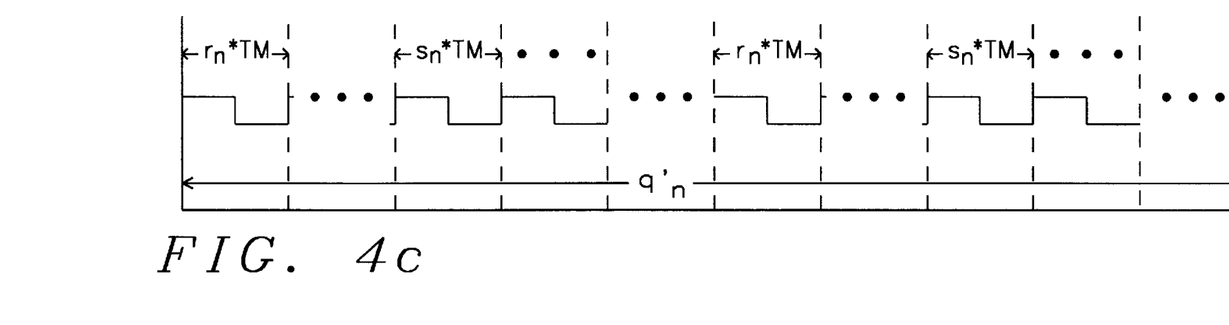

The waveform of the output clock $F_o$ shown in FIG. 4c is created by the method for generating the counting series $S_n$ that is the second embodiment of this invention. In this embodiment, the smallest number $r_n$ and the largest number $s_n$ are calculated as above. The integer portion of the ratio $X_n$ is the smallest number $r_n$ and the smallest number $r_n$ plus one (1) is the largest number $s_n$.

The number of terms $q'_n$ in the counting series $S_n$ is now modified to be the number of terms $N_x$ in all the subseqments as calculated above or the number of terms $N_x$ in all the subseqments plus the number of subsegments depending on which is closer to the original number of terms $q'_n$. That is:

$$q'_n = \begin{array}{c|c} N_x & qn - N_x < \left(N_x + \frac{N_x}{I_r} - q_n\right) \\ N_x + \frac{N_x}{I_r} & \text{otherwise} \end{array}$$

The new interspersal ratio $I'_r$ is either intersperal ratio $I_r$ from above or intersperal ratio $I_r$ plus one ($I_r+1$) and the residual terms are either eliminated or added to every subsegment. If the interspersal ratio $I_r$ is determined by the number $N_r$ of the smallest numbers $r_n$, there will be one occurrence of the smallest number $r_n$ followed by $I_r-1$ occurrences of the largest counting number $s_n$. That is the counting series $S_n$ will be:

$$S_n = \begin{array}{c|c} \underbrace{\underbrace{r_n, s_n, \ldots, s_n}_{X_n}, \underbrace{r_n, s_n, \ldots, s_n}_{X_n}, \ldots, \underbrace{r_n, s_n, \ldots, s_n}_{X_n}}_{N_x} & (qn - N_x) < \left(N_x + \frac{N_x}{I_r} - q_n\right) \\ \underbrace{\underbrace{r_n, s_n, \ldots, s_n}_{X_n}, s_n, \underbrace{r_n, s_n, \ldots, s_n}_{X_n}, s_n, \ldots, \underbrace{r_n, s_n, \ldots, s_n}_{X_n} s_n}_{N_x + \frac{N_x}{I_r}} & \text{otherwise.} \end{array}$$

However, if the interspersal ratio $I_r$ is determined by the number $N_s$ of the largest numbers $s_n$, then there will be $I'_r-1$ occurrences of the smallest number $r_n$ followed by one (1) occurrence of the largest number $s_n$. That is the counting series $S_n$ will be:

$$S_n = \begin{vmatrix} \dfrac{\dfrac{s_n, r_n, \ldots, r_n}{X_n}, \dfrac{s_n, r_n, \ldots, r_n}{X_n}, \ldots, \dfrac{s_n, r_n, \ldots, r_n}{X_n}}{N_x} & (qn - N_x) < \left(N_x + \dfrac{N_x}{I_r} - q_n\right) \\ \dfrac{\dfrac{s_n, r_n, \ldots, r_n, r_n s_n, r_n, \ldots, \underline{r_n}, r_n \ldots, \underline{s_n, r_n, \ldots, r_n}, r_n}{X_n}}{N_x + \dfrac{N_x}{I_r}} & \text{otherwise.} \end{vmatrix}$$

In this case the residual terms $u_n$ are eliminated and the fraction is simplified. This will cause any spurious frequencies or tones that are due to the pulse-stripping jitter to be moved to higher frequencies. The higher frequencies are filtered and produces better performance for applications such as PCM.

Below is an example of the results of each of the cases described in FIGS. 4a, 4b, and 4c. In each example, the ratio $X_n$ is given as:

$$X_n = \frac{f_i}{F_o} = 26\frac{104}{147}.$$

Case 1:
$r_n = 26$
$s_n = 27$
$q_n = 147$
$N_s = 104$
$N_r = 43$
$N_u = 61$ $$S_n = \left(\frac{26, 27, 26, 27, \ldots, 27,}{86} \quad \frac{27, 27, \ldots, 27}{61}\right)$$

Case 2 illustrates the first embodiment of this invention and is shown as:
$r_n = 26$
$s_n = 27$
$q_n = 147$
$N_s = 104$
$N_r = 147 - 104 = 43$
$I_r = \text{int } q_n/N_r = \text{int } 147/43 = \text{int}(3.41860) = 3$
$N_x = I_r N_r = 3 \times 43 = 129$
$N_u = 18$ $$S_n = \left(\frac{\dfrac{x_n}{26, 27, 27}, \dfrac{x_n}{26, 27, 27}, \ldots, \dfrac{x_n}{26, 27, 27}, \dfrac{u_n}{27, \ldots, 27}}{129 \quad\quad 18}\right)$$

Case 2a illustrates the first enhancement of the first embodiment of this invention and is shown as:

$$I_w = \text{int}\frac{N_x}{N_u} = \text{int}\frac{129}{18} = \text{int } 7.1667 = 7$$

$$S_n = \left(\frac{\dfrac{x_1}{26, 27, 27}, \dfrac{x_2}{26, 27, 27}, \dfrac{x_3}{26, \underline{27}, 27, 27}, \ldots, \dfrac{x_{43}}{26, 27, 27}}{S_{un}}\right)$$

In this case, the residual number $s_{un}$ is added into the series after every seventh number.

Case 2b illustrates the second enhancement of the first embodiment of this invention and is shown as:

$$I_w = \text{int}\frac{N_r}{N_u} = \text{int}\frac{43}{18} = \text{int } 2.3889 = 2$$

$$S_n = \left(\frac{\dfrac{x_1}{26, 27, 27}, \dfrac{x_2}{26, 27, 27}, \underline{27}, \dfrac{x_3}{26, 27, 27}, \ldots, \dfrac{x_{43}}{26, 27, 27}}{147}\right)$$

In this case, the residual number $s_{un}$ is added into the series after every second subsegment.

Case 3 illustrates second embodiment of this invention and is shown as:
$r_n = 26$
$s_n = 27$ $$q'_n = N_x \text{ from Case 2} \left(\text{since } 147 - 149 < 129 + \frac{129}{3} - 147\right)$$

$$I_r = \text{int}\frac{q_n}{N_r} = \text{int}\frac{129}{43} = 3$$

$$S_n = \frac{\dfrac{x_n}{26, 27, 27}, \dfrac{x_n}{26, 27, 27}, \ldots, \dfrac{x_n}{26, 27, 27}.}{129}$$

As can be seen in Case 3, the series of counting integers $S_n$ is simplified and thus the count retention table 14 of FIG. 2 is smaller and simpler. Further, the spurious frequencies due to the extra counts created by Case 3 will be of higher frequencies and can be filtered from the resulting signals in a PCM application.

While this invention has been particularly shown and described with reference to the preferred embodiments thereof, it will be understood by those skilled in the art that various changes in form and details is made without departing from the spirit and scope of the invention.

The invention claimed is:

1. A frequency synthesizing system for the generation of a periodic output signal having selected signal periods having a first level and a second level, wherein said selected signal periods constitute a number of at least one periods of a periodic reference signal, comprising:
    a count compiler to generate a series of counting integers representing the number of periods of said periodic reference signal, wherein said counting integers are calculated by a method comprising the steps of:
        dividing of a frequency of the periodic reference signal by a frequency of one of the selected signal periods to form a quotient,
        decomposing of the quotient into a weighted average of a first integer and a second integer such that the first integer is a largest integer lesser than the quotient and the second integer is a value of the first integer plus one,
        simplifying said quotient to a mixed number having an integer and a fraction, wherein the fraction has a numerator and a denominator, creating the series of counting integers that include the first and second integers, wherein the number of counting integers is the value of the denominator and the number of second integers in the series of counting integers is the value of the numerator, and the number of first integers is the difference of the denominator and the numerator;

distributing the first and second integers within subsegments of the series of counting integers in a uniform manner over the series of counting integers and appending any residual counting integers to the last of the subsegments;

a count series retention table coupled to the count compiler to retain a plurality of the series of counting integers, wherein each series of counting integers represent one of the selected signal periods, and wherein a count select signal chooses one of the series of counting integers and a count signal sequentially places each counting integer of the series of counting integers on a count output;

a count incrementing means to increment the count signal having a count select decoder coupled to the count select signal to determine the number of counting integers, and an output counter coupled to the periodic output signal to increment the increment count signal to a next integer in the series of counting integers; and a frequency generation means to develop the periodic output signal, including:
  a periodic reference signal counter coupled to the periodic reference signal and to the count output, wherein said periodic reference signal counter will create a max count signal when the number of periods of the periodic reference signal is equal to the counting integers, and
  a toggling means coupled to the periodic reference signal counter to alternate the periodic output signal from the first level to the second level and return to the first level at the reception of the count signal.

2. The system of claim 1 wherein a jitter property of said periodic output signal is less than one period of the periodic reference signal.

3. The system of claim 1 wherein distributing the first integers and the second integers in the uniform manner to form the counting integers is accomplished by the steps of:
  comparing the number of the first integers to the number of the second integers;
  dividing the denominator by a lessor of the number of the first integers and the number of the second integers to form an approximation quotient;
  truncating any fractional part from the approximation quotient to form an interspersal ratio which is a size of a subsegment of the counting series;
  when the lessor of the numbers of the first integers and the number of second integers is the number of first integers, setting the number of first integers in one subsegment to one and setting the number of second integers in the one subsegment to the interspersal ratio less one;
  when the lessor of the numbers of the first integers and the number of second integers is the number of second integers, setting the number of first integers in one subsegment to the interspersal ratio less one and setting the number of second integers in the one subsegment to one;
  arranging the subsegment of the counting integers series such that the first integers are arranged firstly in the subsegment and the second integers are arranged secondly in the subsegment;
  repeating each subsegment until the number of subsegments is equal to the lessor of the numbers of the first integers and the number of second integers; and
  appending a set of residual numbers subsequent to the last subsegment of the counting integers series by the steps of:
    when the lessor of the numbers of the first integers and the number of second integers is the number of first integers, repeating the second integers until the number of second integers have been placed in the counting integers series, and
    when the lessor of the numbers of the first integers and the number of second integers is the number of second integers, repeating the first integers until the number of first integers have been placed in the counting integers series.

4. The system of claim 3 wherein the first integers and the second integers are further distributed by the steps of:
  determining a residual interspersal ratio by dividing the product of the interspersal ratio and the lessor of the number of first integers and the second integers by a number of the residual numbers; and
  dispersing said set of residual numbers over the series of counting integers such that one residual number is placed after a group of series of the counting integers whereby said group of series of the counting integers is equal to the residual interspersal ratio.

5. The system of claim 3 wherein the first integers and the second integers are further distributed by the steps of:
  determining a residual interspersal ratio by dividing the lessor of the number of first integers and the second integers by a number of the residual numbers; and
  dispersing said set of residual numbers over the subsegments of the series of counting integers such that one residual number is placed after a number of subsegments whereby said number of subsegment is equal to the residual interspersal ratio.

6. The system of claim 1 wherein modifying the selected signal periods is accomplished by changing the count signal sequence to another series of counting integers of the plurality of the series of counting integers.

7. The system of claim 1 wherein the count series retention table comprises:
  a plurality of look-up tables wherein each look-up table is coupled to the count signal and wherein each look-up table contains a series of the plurality of series of the counting integers such that each counting integer is placed at a look-up table output at each increment of the count signal, and
  a look-up table multiplexer coupled to each look-up table output of the plurality of look-up tables such that the counting integer selected by the count select signal is placed on the count output.

8. The system of claim 1 wherein the count series retention table is a read-only memory comprising:
  an array of a multitude of data retention cells coupled to the count compiler to retain the plurality of the series of counting integers and coupled to the count output to place the counting integer at said count output; and
  an array addressing means wherein the count select chooses a cell of the array of cells containing a beginning integer in the series of counting integers and the count signal will sequentially select each adjacent cell containing each counting integer of the series of counting integers.

9. The system of claim 1 wherein the periodic reference signal contains no more than one transition from the first level to the second logic level and contains no more than one transition from the second logic level to the first logic level during the period of the periodic reference signal.

10. The system of claim 1 wherein the count signal counts at each alternating of the periodic output signal and the periodic reference signal counter counts at each alternating of the periodic reference signal.

11. A frequency synthesizing circuit for the generation of a periodic output signal of selected signal periods having a first level and a second level, wherein said selected signal periods constitute a number of at least one periods of a periodic reference signal, comprising:

a count series retention table to retain a plurality of counting integers representing the number of periods of said periodic reference signal, wherein said counting integers are generated in a silicon compiler, wherein said silicon compiler forms said counting integers by a method comprising the steps of:

dividing of one of the selected signal periods by the period of the periodic reference signal to form a quotient, decomposing of the quotient into a weighted average of a first integer and a second integer such that the first integer is a largest integer lesser than the quotient and the second integer is a value of the first integer plus one, simplifying said quotient to a mixed number having an integer and a fraction, wherein the fraction has a numerator and a denominator, and creating the series of counting integers that include the first and second integers, wherein the number of counting integers is the value of the denominator and the number of second integers in the series of counting integers is the value of the numerator, and the number of first integers is the difference of the denominator and the numerator; and distributing the first and second integers within subsegments of the series of counting integers in a uniform manner over the series of counting integers and appending any residual counting integers to the last of the subsegments, wherein a plurality of the series of counting integers are placed in said count series retention table by the silicon compiler, wherein each series of counting integers represent one of the selected signal periods, and wherein a count select signal chooses one of the series of counting integers and a count signal sequentially places each counting integer of the series of counting integers on a count output;

a count incrementing means to increment the count signal having a count select decoder coupled to the count select signal to determine the number of counting integers, and an output counter coupled to the periodic output signal to increment the increment count signal to a next integer in the series of counting integers; and a frequency generation means to develop the periodic output signal, including:

a periodic reference signal counter coupled to the periodic reference signal and to the count output, wherein said periodic reference signal counter will create a max count signal when the number of periods of the periodic reference signal is equal to the counting integers, and a toggling means coupled to the periodic reference signal counter to alternate the periodic output signal from the first level to the second level and return to the first level at the reception of the count signal.

12. The circuit of claim 11 wherein a jitter property of said periodic output signal is less than one period of the periodic reference signal.

13. The circuit of claim 11 wherein modifying the selected signal period is accomplished by changing the count signal sequence to another series of counting integers of the plurality of the series of counting integers.

14. The circuit of claim 11 wherein distributing the first integers and the second integers in the uniform manner to form the counting integers is accomplished by the steps of:

comparing the number of the first integers to the number of the second integers;

dividing the denominator by a lessor of the number of the first integers and the number of the second integers to form an approximation quotient;

truncating any fractional part from the approximation quotient to form an interspersal ratio which is a size of a subsegment of the counting series;

when the lessor of the numbers of the first integers and the number of second integers is the number of first integers, setting the number of first integers in one subsegment to one and setting the number of second integers in the one subsegment to the interspersal ratio less one;

when the lessor of the numbers of the first integers and the number of second integers is the number of second integers, setting the number of first integers in one subsegment to the interspersal ratio less one and setting the number of second integers in the one subsegment to one;

arranging the subsegment of the counting integers series such that the first integers are arranged firstly in the subsegment and the second integers are arranged secondly in the subsegment;

repeating each subsegment until the number of subsegments is equal to the number of the series of counting integers;

when the lessor of the numbers of the first integers and the number of second integers is the number of first integers, repeating the second integers until the number of second integers have been placed in the counting integers series; and when the lessor of the numbers of the first integers and the number of second integers is the number of second integers, repeating the first integers until the number of first integers have been placed in the counting integers series.

15. The circuit of claim 14 wherein the first integers and the second integers are further distributed by the steps of:

determining a residual interspersal ratio by dividing the product of the interspersal ratio and the lessor of the number of first integers and the second integers by a number of the residual numbers; and dispersing said set of residual numbers over the series of counting integers such that one residual number is placed after a group of series of the counting integers whereby said group of the counting integers is equal to the residual interspersal ratio.

16. The circuit of claim 14 wherein the first integers and the second integers are further distributed by the steps of:

determining a residual interspersal ratio by dividing the lessor of the number of first integers and the second integers by a number of the residual numbers; and dispersing said set of residual numbers over the subsegments of the series of counting integers such that one residual number is placed after a number of subsegments whereby said number of subsegment is equal to the residual interspersal ratio.

17. The circuit of claim 11 count series retention table comprises:
  a plurality of look-up tables wherein each look-up table is coupled to the count signal and wherein each look-up table contains a series of the plurality of series of the counting integers such that each counting integer is placed at a look-up table output at each increment of the count signal, and
  a look-up table multiplexer coupled to each look-up table output of the plurality of look-up tables such that the counting integer selected by the count select signal is placed on the count output.

18. The circuit of claim 11 wherein the count series retention table is a read-only memory comprising:
  an array of a multitude of data retention cells coupled to the silicon compiler to retain the plurality of the series of counting integers and coupled to the count output to place the counting integer at said count output; and
  an array addressing means wherein the count select chooses a cell of the array of cells containing a beginning integer in the series of counting integers and the count signal will sequentially select each adjacent cell containing each counting integer of the series of counting integers.

19. The circuit of claim 11 wherein the periodic reference signal contains no more than one transition from the first level to the second logic level and contains no more than one transition from the second logic level to the first logic level during the period of the periodic reference signal.

20. The circuit of claim 11 wherein the count signal counts at each alternating of the periodic output signal and the periodic reference signal counter counts at each alternating of the periodic reference signal.

21. A frequency synthesizing system for the generation of a periodic output signal of selected signal periods having a first level and a second level, wherein said selected signal periods constitute a number of at least two periods of a periodic reference signal, comprising:
  a count compiler to generate a series of counting integers representing the number of periods of said periodic reference signal, wherein said counting integers are calculated by a method comprising the steps of:
    dividing of a frequency of the periodic reference signal by a frequency of one of the selected signal periods to form a quotient,
    decomposing of the quotient into a weighted average of a first integer and a second integer such that the first integer is a largest integer lesser than the quotient and the second integer is a value of the first integer plus one,
    simplifying said quotient to a mixed number having an integer and a fraction, wherein the fraction has a numerator and a denominator,
    creating the series of counting integers that include the first and second integers, wherein the number of counting integers is the value of the denominator and the number of second integers in the series of integers is the value of the numerator, and the number of first integers is the difference of the denominator and the numerator;
    distributing the first and second integers within subsegments of the series of counting integers in a uniform manner over the series of counting integers, and
    setting the number of counting integers in the series of counting integers to a product of a number of subsegments and the lessor of the number of first integers and the number of second integers;
  a count series retention table coupled to the count compiler to retain a plurality of the series of counting integers, wherein each series of counting integers represent one of the selected signal periods, and wherein a count select signal chooses one of the series of counting integers and a count signal sequentially places each counting integer of the series of counting integers on a count output;
  a count incrementing means to increment the count signal having a count select decoder coupled to the count select signal to determine the number of counting integers, and an output counter coupled to the periodic output signal to increment the count signal to a next integer in the series of counting integers; and
  a frequency generation means to develop the periodic output signal, including:
    a periodic reference signal counter coupled to the periodic reference signal and to the count output, wherein said periodic reference signal counter will create a max count signal when the number of periods of the periodic reference signal is equal to the counting integers, and
    a toggling means coupled to the periodic reference signal counter to alternate the periodic output signal from the first level to the second level and return to the first level at the reception of the count signal.

22. The system of claim 21 wherein distributing the first integers and the second integers in the uniform manner to form the counting integers is accomplished by the steps of:
  comparing the number of the first integers to the number of the second integers;
  dividing the denominator by a lessor of the number of the first integers and the number of the second integers to form an approximation quotient;
  truncating any fractional part from the approximation quotient to form an interspersal ratio which is a size of the subsegment of the counting series;
  when the lessor of the numbers of the first integers and the number of second integers is the number of first integers, setting the number of first integers in one subsegment to one and setting the number of second integers in the one subsegment to the interspersal ratio less one;
  when the lessor of the numbers of the first integers and the number of second integers is the number of second integers, setting the number of first integers in one subsegment to the interspersal ratio less one and setting the number of second integers in the one subsegment to one;
  arranging the subsegment of the counting integers series such that the first integers are arranged firstly in the subsegment and the second integers are arranged secondly in the subsegment; and
  repeating each subsegment until the number of subsegments is equal to the lessor of the numbers of the first integers and the number of second integers.

23. The system of claim 21 wherein spurious tones of the periodic output signal are at a higher frequency and are filtered from said period output signal.

24. The system of claim 21 wherein modifying the selected signal periods is accomplished by changing the count signal sequence to another series of counting integers of the plurality of the series of counting integers.

25. The system of claim 21 wherein the count series retention table comprises:

a plurality of look-up tables wherein each look-up table is coupled to the count signal and wherein each look-up table contains a series of the plurality of series of the counting integers such that each counting integer is placed at a look-up table output at each increment of the count signal, and a look-up table multiplexer coupled to each look-up table output of the plurality of look-up tables such that the counting integer selected by the count select signal is placed on the count output.

26. The system of claim 21 wherein the count series retention table is a read-only memory comprising:

an array of a multitude of data retention cells coupled to the count compiler to retain the plurality of the series of counting integers and coupled to the count output to place the counting integer at said count output; and an array addressing means wherein the count select chooses a cell of the array of cells containing a beginning integer in the series of counting integers and the count signal will sequentially select each adjacent cell containing each counting integer of the series of counting integers.

27. The system of claim 21 wherein the periodic reference signal contains no more than one transition from the first level to the second logic level and contains no more than one transition from the second logic level to the first logic level during the period of the periodic reference signal.

28. The system of claim 21 wherein the output signal counter counts at each alternating of the periodic output signal and the periodic reference signal counter counts at each alternating of the periodic reference signal.

29. A method to construct a series of counting integers for generating a periodic output signal having selected signal periods having a first level and a second level, wherein said selected signal periods constitutes a number of at least one periods of periodic reference signal, comprising the steps of:

a count compiler to generate a series of counting integers representing the number of periods of said periodic reference signal, wherein said counting integers are calculated by a method comprising the steps of:

dividing of a frequency of the periodic reference signal by a frequency of one of the selected signal periods to form a quotient, decomposing of the quotient into a weighted average of a first integer and a second integer such that the first integer is a largest integer lesser than the quotient and the second integer is a value of the first integer plus one, simplifying said quotient to a mixed number having an integer and a fraction, wherein the fraction has a numerator and a denominator, creating the series of counting integers that include the first and second integers, wherein the number of counting integers is the value of the denominator and the number of second integers in the series of periodic integers is the value of the numerator, and the number of first integers is the difference of the denominator and the numerator;

distributing the first and second integers within subsegments of the series of counting integers in a uniform manner over the series of counting integers.

30. The method of claim 29 further comprising appending any residual counting integers to the last of the subsegments.

31. The method of claim 29 wherein distributing the first integers and the second integers in the uniform manner to form the counting integers is accomplished by the steps of:

comparing the number of the first integers to the number of the second integers;

dividing the denominator by a lessor of the number of the first integers and the number of the second integers to form an approximation quotient;

truncating any fractional part from the approximation quotient to form an interspersal ratio which is a size of a subsegment of the counting series;

when the lessor of the numbers of the first integers and the number of second integers is the number of first integers, setting the number of first integers in one subsegment to one and setting the number of second integers in the one subsegment to the interspersal ratio less one;

when the lessor of the numbers of the first integers and the number of second integers is the number of second integers, setting the number of first integers in one subsegment to the interspersal ratio less one and setting the number of second integers in the one subsegment to one;

arranging the subsegment of the counting integers series such that the first integers are arranged firstly in the subsegment and the second integers are arranged secondly in the subsegment;

repeating each subsegment until the number of subsegments is equal to the lessor of the numbers of the first integers and the number of second integers; and appending a set of residual numbers subsequent to the last subsegment of the counting series by the steps of:

when the lessor of the numbers of the first integers and the number of second integers is the number of first integers, repeating the second integers until the number of second integers have been placed in the counting series, and when the lessor of the numbers of the first integers and the number of second integers is the number of second integers, repeating the first integers until the number of first integers have been placed in the counting integers series.

32. The method of claim 31 wherein the first integers and the second integers are further distributed by the steps of:

determining a residual interspersal ratio by dividing the product of the interspersal ratio and the lessor of the number of first integers and the second integers by a number of the residual numbers; and dispersing said set of residual numbers over the series of counting integers such that one residual number is placed after a group of series of the counting integers whereby said group of the counting integers is equal to the residual interspersal ratio.

33. The method of claim 31 wherein the first integers and the second integers are further distributed by the steps of:

determining a residual interspersal ratio by dividing the lessor of the number of first integers and the second integers by a number of the residual numbers; and dispersing said set of residual numbers over the subsegments of the series of counting integers such that one residual number is placed after a number of subsegments whereby said number of subsegment is equal to the residual interspersal ratio.

34. A method to construct a series of counting integers for generating a periodic output signal having selected signal periods having a first level and a second level, wherein said selected signal periods constitutes a number of at least one periods of periodic reference signal, comprising the steps of:

dividing of a frequency of the periodic reference signal by a frequency of one of the selected signal periods to form a quotient, decomposing of the quotient into a weighted average of a first integer and a second integer such that the first integer is a largest integer lesser than the quotient and the second integer is a value of the first integer plus one, simplifying said quotient to a mixed number having an integer and a fraction, wherein the fraction has a numerator and a denominator, creating the series of counting integers that include the first and second integers, wherein the number of counting integers is the value of the denominator and the number of second integers in the series of integers is the value of the numerator, and the number of first integers is the difference of the denominator and the numerator;

distributing the first and second integers within subsegments of the series of counting integers in a uniform manner over the series of counting integers, and setting the number of counting integers in the series of counting integers to a product of a number of subsegments and the lessor of the number of first integers and the number of second integers.

35. The method of claim 34 wherein the distributing the first and second integers comprise the steps of:

comparing the number of the first integers to the number of the second integers;

dividing the denominator by a lessor of the number of the first integers and the number of the second integers to form an approximation quotient;

truncating any fractional part from the approximation quotient to form an interspersal ratio which is a size of the subsegment of the counting integers series;

when the lessor of the numbers of the first integers and the number of second integers is the number of first integers, setting the number of first integers in one subsegment to one and setting the number of second integers in the one subsegment to the interspersal ratio less one;

when the lessor of the numbers of the first integers and the number of second integers is the number of second integers, setting the number of first integers in one subsegment to the interspersal ratio less one and setting the number of second integers in the one subsegment to one;

arranging the subsegment of the counting integers series such that the first integers are arranged firstly in the subsegment and the second integers are arranged secondly in the subsegment; and repeating each subsegment until the number of subsegments is equal to the lessor of the numbers of the first integers and the number of second integers.

36. The method of claim 34 further comprising filtering higher frequency spurious tones present in the periodic output signal.

* * * * *